US012689363B2

(12) United States Patent
Sampayan et al.

(10) Patent No.: US 12,689,363 B2
(45) Date of Patent: Jul. 21, 2026

(54) FAST LATCHING SWITCHES

(71) Applicants: Lawrence Livermore National Security, LLC, Livermore, CA (US); Opcondys, Inc., Manteca, CA (US)

(72) Inventors: Stephen E. Sampayan, Manteca, CA (US); Kristin Cortella Sampayan, Manteca, CA (US)

(73) Assignees: Lawrence Livermore National Security, LLC, Livermore, CA (US); Opcondys, Inc., Manteca, CA (US)

( * ) Notice: Subject to any disclaimer, the term of this patent is extended or adjusted under 35 U.S.C. 154(b) by 177 days.

(21) Appl. No.: 18/398,068

(22) Filed: Dec. 27, 2023

(65) Prior Publication Data

US 2024/0213974 A1 Jun. 27, 2024

Related U.S. Application Data

(60) Provisional application No. 63/435,443, filed on Dec. 27, 2022.

(51) Int. Cl.
*H03K 17/04* (2006.01)
*H03K 17/94* (2006.01)

(52) U.S. Cl.
CPC ......... *H03K 17/0403* (2013.01); *H03K 17/94* (2013.01)

(58) Field of Classification Search
CPC .................................................. H03K 17/0403
USPC ........................................................ 327/374
See application file for complete search history.

(56) References Cited

U.S. PATENT DOCUMENTS

| | | | |
|---|---|---|---|
| 4,984,518 A * | 1/1991 | Yarrington | F42B 3/113 102/201 |
| 8,563,930 B2 | 10/2013 | Harris et al. | |
| 9,142,339 B2 | 9/2015 | Sampayan | |
| 9,748,859 B2 | 8/2017 | Sampayan | |

* cited by examiner

*Primary Examiner* — Tomi Skibinski

(74) *Attorney, Agent, or Firm* — HARNESS, DICKEY & PIERCE PLC

(57) ABSTRACT

Devices, methods and techniques related to ultrafast latching switches are disclosed. In one example aspect, a device includes a photoconductive switch and a non-mechanical latching switch configured to maintain a state after the state is activated. The non-mechanical latching switch is coupled to the photoconductive switch. The non-mechanical latching switch is configured to be triggered to switch to an opposite state upon an activation of the photoconductive switch.

20 Claims, 11 Drawing Sheets activate a non-mechanical latching device to operate in a first state

1010 switch the non-mechanical latching device to a second state by activating the photoconductive switch

1020

FAST LATCHING SWITCHES

CROSS REFERENCE TO RELATED APPLICATIONS

This patent document claims priority to and benefits of U.S. Provisional Patent Application No. 63/435,443 entitled "System and Method for Fast Extinguishing of Conduction in Latching Switches" and filed on Dec. 27, 2022. The entire contents of the before-mentioned patent application are incorporated by reference as part of the disclosure of this patent document.

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This document generally relates to switches in electric circuits, and more specifically, providing ultrafast latching switches in the circuits using a photoconductive switch.

BACKGROUND

A latching switch is a switch that maintains its state after being activated. Many devices operate with latching switches, and they have widespread application within circuits. The delays in turning on and off the latching switches can limit the frequency of operations and result in energy losses.

SUMMARY

Devices, methods and techniques related to providing ultrafast latching switches in the circuits are disclosed.

In one example aspect, a device includes a photoconductive switch and a non-mechanical latching switch configured to maintain a state after the state is activated. The latching switch is coupled to the photoconductive switch. The non-mechanical latching switch is configured to be triggered to switch to an opposite state upon an activation of the photoconductive switch.

In another example aspect, a method for switching a non-mechanical latching device includes activating the non-mechanical latching device to operate in a first state and switching the non-mechanical latching device to a second state by activating a photoconductive switch. The non-mechanical latching device is configured to maintain the first state after the first state is activated. The non-mechanical latching device is coupled to the photoconductive switch.

The above and other aspects and features of the disclosed technology are described in greater detail in the drawings, the description and the claims.

DETAILED DESCRIPTION

A switch is a device that is configured to interrupt the current flow in a circuit. Switches can be of two types: mechanical and non-mechanical. Mechanical Switches are physical switches that are activated physically, e.g., by pressing or releasing its contacts. Non-mechanical switches, on the other hand, do not require any physical contact to control a circuit—an electronic switch and an optical switch are examples of non-mechanical switches that are activated and deactivated in response to change in the electronic or optical properties of the switch materials. The electronic switches are also referred to as solid state switches with no physical moving parts and hence no physical contacts.

Latching switches are switches that maintain their states after being activated and have widespread application within circuits. Latching switches can be implemented using certain junction and bulk conduction switching devices that latch on or continue to conduct once closed and must experience a zero current condition or slight reverse current before they are in the off state again. For example, a thyristor is a solid-state semiconductor device with four layers of alternating P- and N-type materials. The thyristor conducts when the gate receives a current trigger and continues to conduct until the voltage across the device is reverse-biased or until the voltage is removed. Thyristors are capable of blocking very high voltages and carrying high currents at low loss. Commercially available silicon thyristors can block as much as 7500 V and continuously conduct up to 3600 A. Once triggered, thyristor conduction is self-sustaining until disrupted.

Non-mechanical switches in general can achieve a higher switching speed as compared to mechanical ones. For instance, a 5 kV, 4.6 kA thyristor turns on in ≈4 microseconds and off in ≈400 microseconds. A solenoid-operated circuit breaker opens in 10 s to 100 s of milliseconds while thermally operated circuit breakers operate in 1-10 seconds. However, turn-on delays on the order of microseconds and turn-off times of hundreds of microseconds are typical for high power non-mechanical devices. Such switching characteristics limit the frequency of operation to low kilohertz rates and result in high energy losses.

This patent document discloses techniques that can be implemented in various embodiments to provide a non-mechanical latching switch. In particular, a fast switch with a transition time of a few nanoseconds can be combined with non-mechanical latching switches (e.g., junction or bulk conduction devices, such as thyristors, silicon-controlled rectifiers, or avalanche photoconductive semiconductor switches) such that an external counter-pulse or a short can be provided to the latching switches to force a zero current and reduce turnoff time, thereby increasing switching frequency.

Figures 1A, 1B:
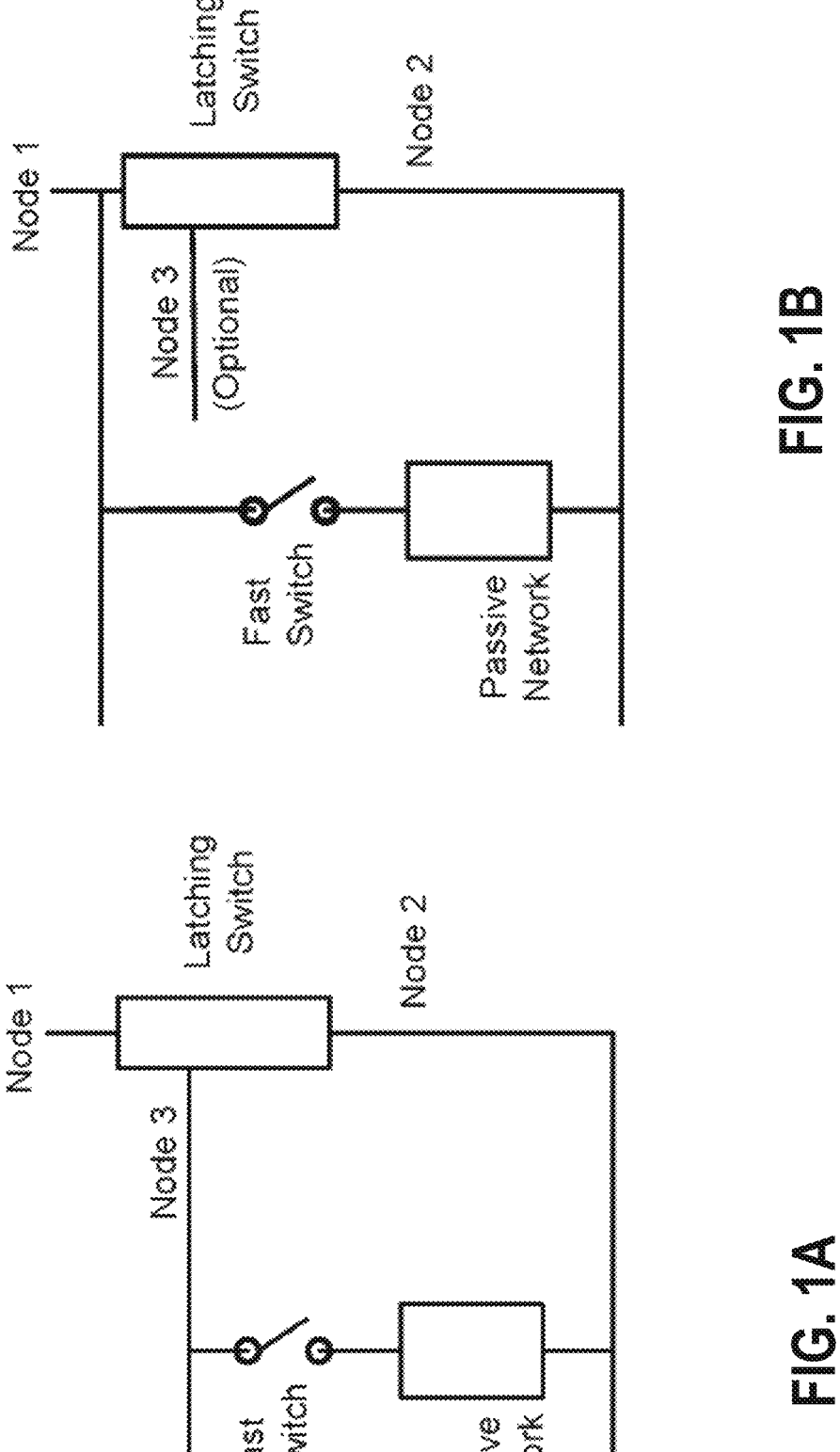
FIG. 1A illustrates an example configuration that includes a fast switch in accordance with one or more embodiments of the present technology.
FIG. 1B illustrates another example configurations that implements a fast switch in accordance with one or more embodiments of the present technology.

FIG. 1A illustrates an example configuration that includes a fast switch in accordance with one or more embodiments of the present technology. In this example configuration, a passive network (with elements that receive energy from the circuit) and a fast switch are connected to controlling points of the latching switch. The latching switch is triggered to turn on with a signal on node 3 to conduct current between nodes 1 and 2. Once current begins to flow through the latching switch, it does not cease until a zero current is experienced. The fast switch can be configured to close such that the passive network generates a counter-pulse or a short to node 3 to force a zero current, thereby extinguishing conduction in the latching switch.

FIG. 1B illustrates another example configuration that implements a fast switch in accordance with one or more embodiments of the present technology. In this example, a passive network and fast switch are connected to nodes 1 and 2, along with the latching switch. The latching switch is triggered to conduct current between nodes 1 and 2 with an optional signal on node 3 or with an external trigger such as a light source. Once current begins to flow through the latching switch, it does not cease until a zero current is experienced. The fast switch can be configured to close such that the passive network generates a counter-pulse or a short across nodes 1 and 2 to force a zero current and extinguish conduction in latching switch.

Figure 2A:
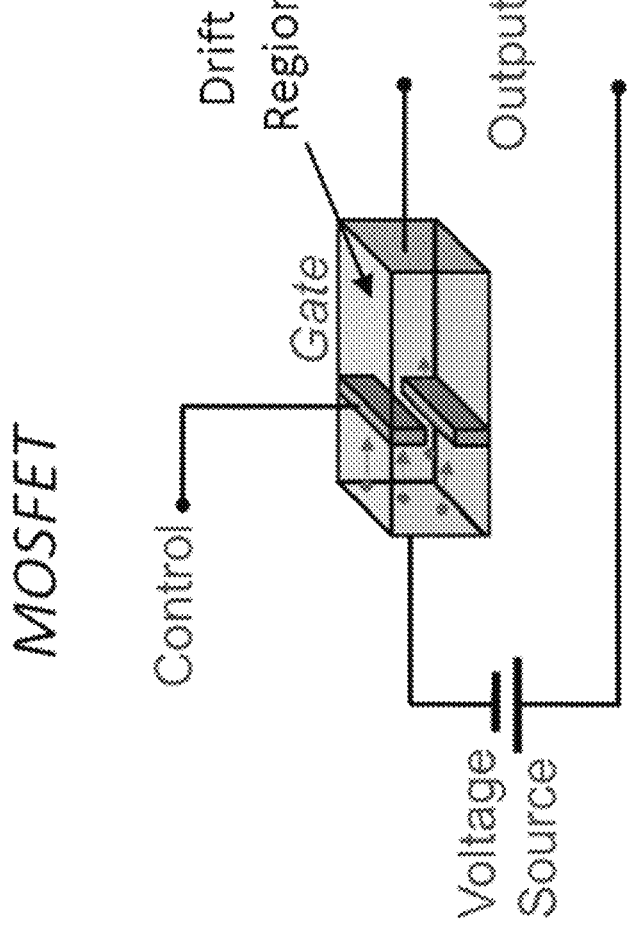
FIG. 2A shows a schematic diagram of an example metal-oxide-semiconductor field-effect transistor (MOSFET) configuration.

In some embodiments, the fast switch can be implemented using a photoconductive switch. A photoconductive device can exhibit transconductance control capability similar to a metal-oxide-semiconductor field-effect transistor (MOSFET). FIG. 2A shows a schematic diagram of an example MOSFET configuration. When a voltage is applied between two opposing terminals (e.g., a voltage source and an output), a third intervening terminal (e.g., a gate) can be used to control the current, I, through the device. The action at the control electrode is delayed at the drain by the carrier transit time. This delay is proportional to $x/\mu E$, where x is the drift length, $\mu$ is the carrier mobility, and E is the applied electric field. Because the applied field is limited by intrinsic material properties, such devices are inherently slow for handling high voltages and can lead to high energy loss. In this example configuration, the turn-on time $t_{on}$ can be approximated as $$t_{on} \approx \frac{1}{E_c}\frac{V_{ds}}{v_d}.$$

When operating around 10 kV, $t_{on}$ is around 100's ns.

Figure 2B:
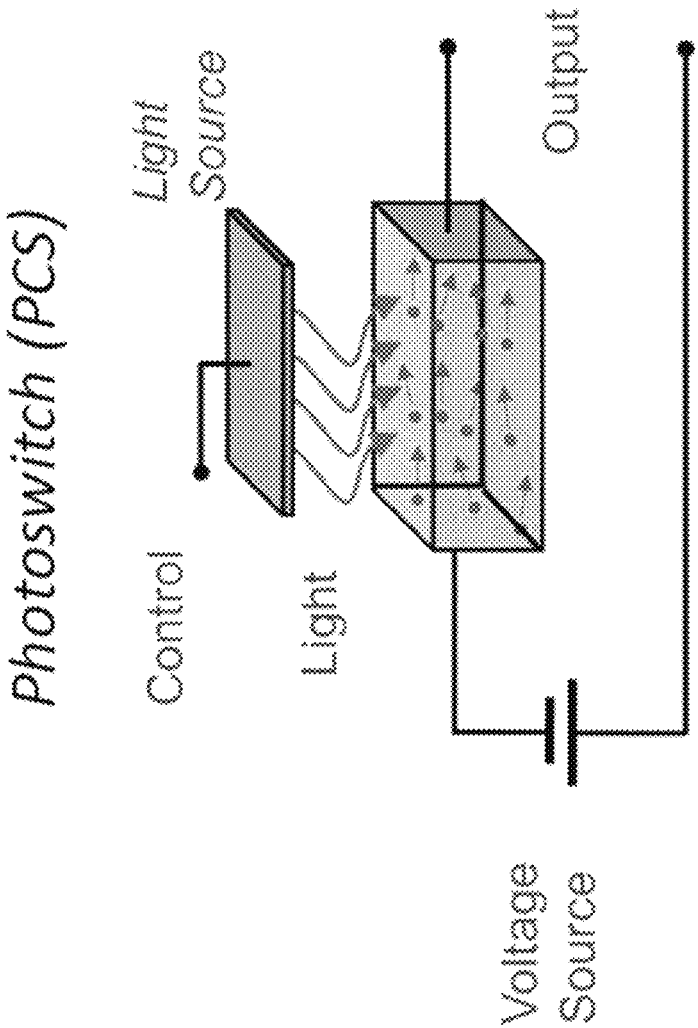
FIG. 2B shows a schematic diagram of an example photoconductive device that includes wide bandgap material in accordance with one or more embodiments of the present technology.
Figure 3:
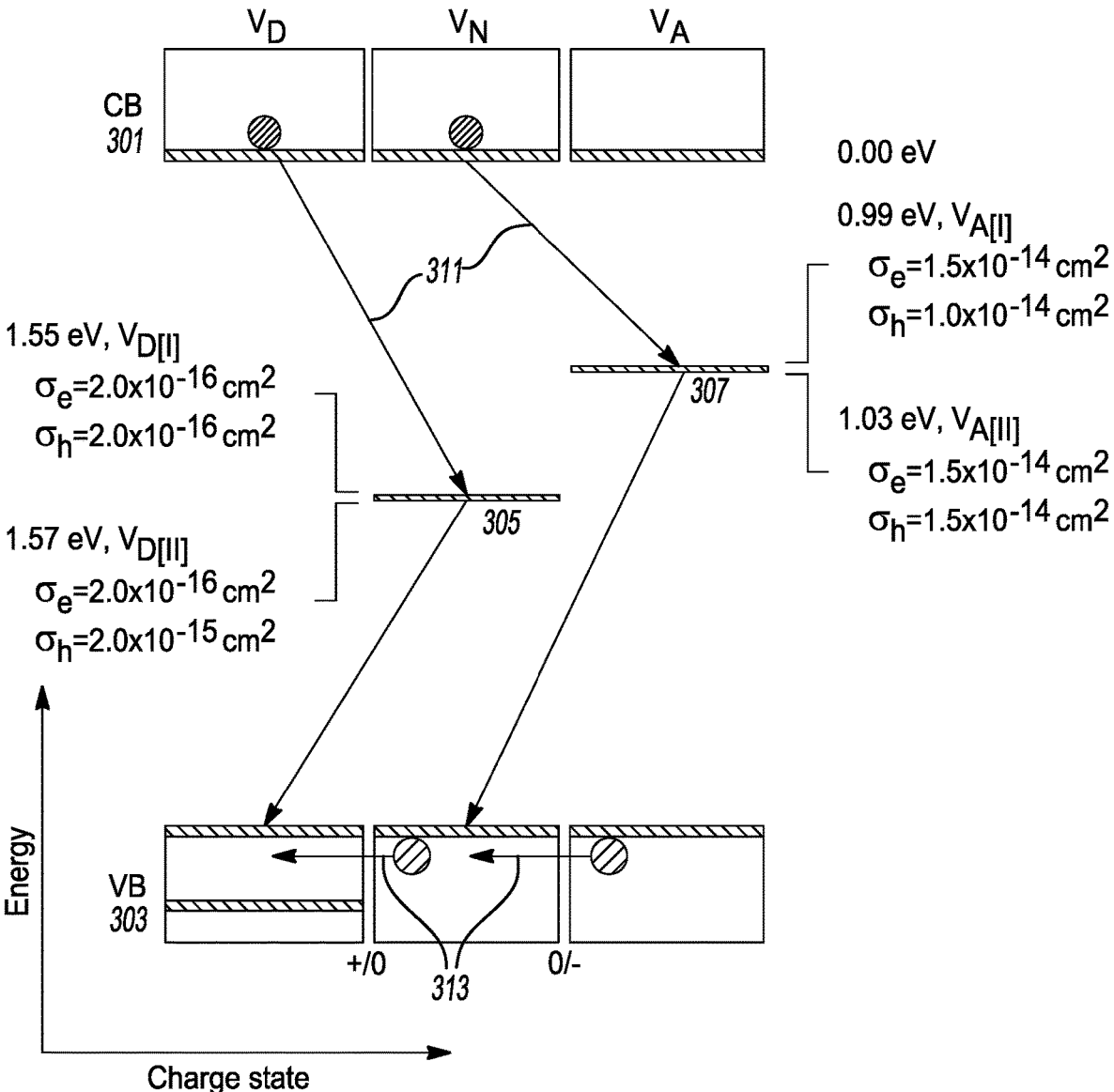
FIG. 3 shows a schematic diagram demonstrating an exemplary bandgap structure in a doped crystalline material.

A photoconductive device is an electrical device that operates based on the optical conductivity of a material, e.g., an increase in the electrical conductance as a consequence of irradiation with light. Direct control of carriers by photons has distinct advantages. For instance, if the illumination is transverse to the current, bulk control is fundamentally limited only by speed of light transit time. Transition losses are therefore significantly lower as compared to a standard junction device. FIG. 2B shows a schematic diagram of an example photoconductive device that includes wide band-gap material in accordance with one or more embodiments of the present technology. Wide bandgap conduction is induced by exciting carriers from mid-bandgap traps. FIG. 3 shows a schematic diagram demonstrating an exemplary bandgap structure in a doped crystalline material (e.g., Vanadium doped silicon carbide). FIG. 3 depicts the conduction band (CB) 301 and valance band (VB) 303. Two mid-gap states (e.g., Vanadium sites) 305 and 307 within the band gap have been observed. During excitation, Vanadium sites 305 and 307 become effective recombination centers. By imposing the conditions of energy and charge conservation, the allowable transitions for electrons as charge carriers (311) and holes as charge carriers (313) are shown. It can be reasonably concluded, based on this diagram, that excited carriers that are pumped into the conduction band to make the material conductive eventually decay according to the measured cross sections of the mid-states in the band gap created by the dopant (e.g., Vanadium). As these mid-states fill, the only other decay path is to continue down into the valance band so that, in effect, mid band cross sections appear to diminish in magnitude so that more time is required for the charge trapping process.

The transconductance property in a photoconductive device is an approximation. The carriers decay determines the electrical pulse response and can be intentionally designed into the material crystal lattice. For most materials, the conductance is very low (e.g., high resistance around $10^8$ ohm) in the quiescent state. In correctly designed materials, however, optical pumping can excite charge carriers into the conduction band, rendering the material conductive. Controlled carrier decay then results from the physical recombination or "trapping" based on the designed material crystal lattice of the material.

The transconductance of a photoconductive material can be obtained as follows. First, a general expression for the behavior of the charge carrier density, which is proportional to the conductance, g(t), can be described using the continuity equation:

$$\frac{dg(t)}{dt} + \frac{g(t)}{\tau} = \frac{g_o}{\tau}S(t) \qquad \text{Eq. (1)}$$

Here, $\tau$ is the recombination time, $g_o$ is the maximum conductivity, and S(t) is the normalized optical intensity. Eq. (1) describes the excitation of charge carriers by function S(t) and the subsequent trapping with a time constant $\tau$.

The general solution to Eq. (1) from t=0 is:

$$g(t) \propto e^{-\frac{t}{\tau}}\int_0^t S(t')e^{\frac{t'}{\tau}}dt' \qquad \text{Eq. (2)}$$

5

Therefore, the carriers within a photoconductive material under an optical pump can be described by the above integral equation. As an example, with a prompt excitation impulse "spike," δ(t), the integral for g(t) is an exponential decay. But for slowly varying S(t) compared to τ, the integral for g(t) reduces to being proportional to S(t). In other words, the photoconductive material exhibits a linear transconductance-like property with an optical excitation when the recombination time, τ, is small (e.g., around or below 1 ns) compared to the characteristic time of the highest frequency components of the electrical signal controlling the light source (e.g., around 10 ns in power electronics).

Figure 4:
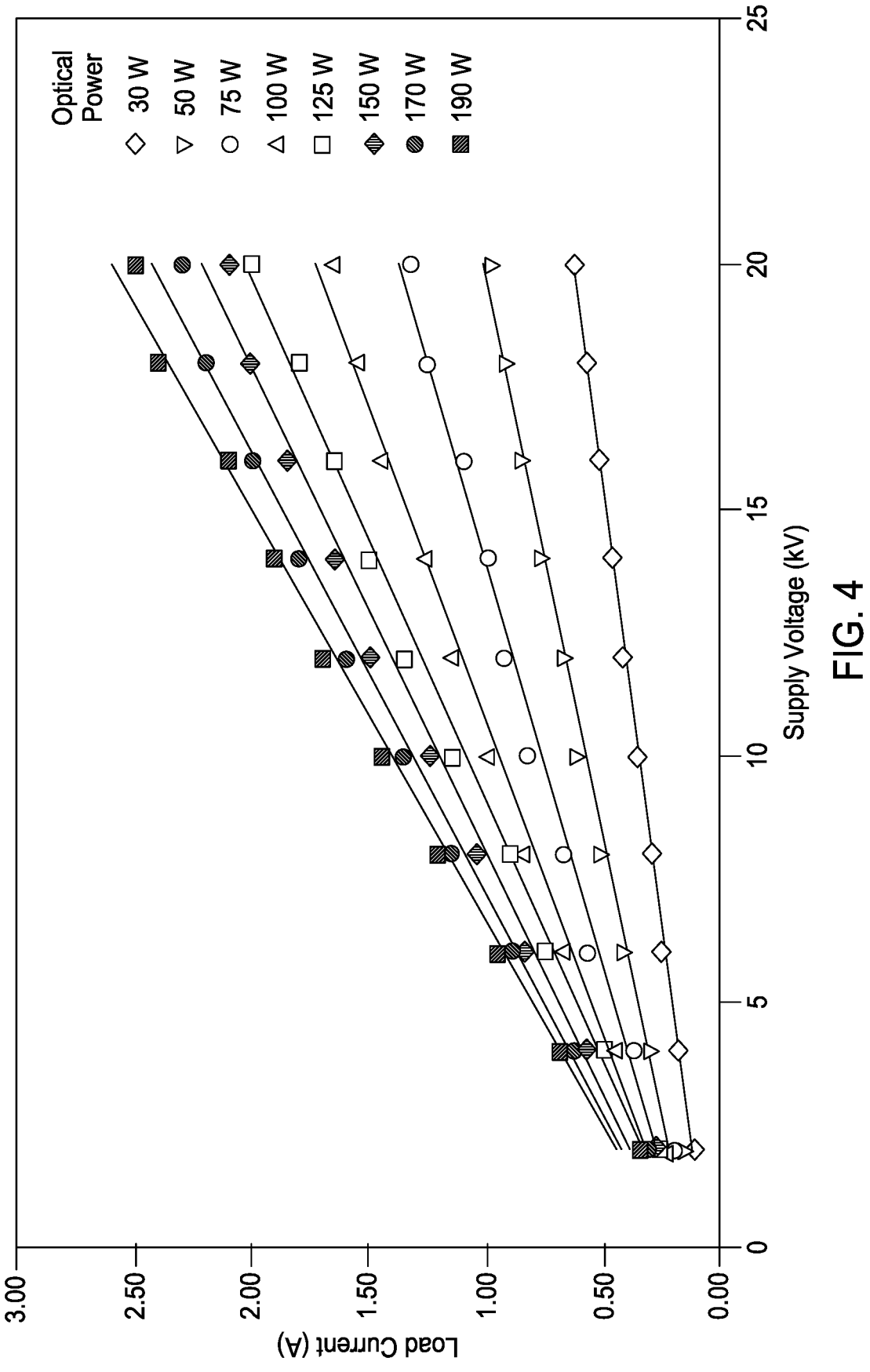
FIG. 4 is an example plot illustrating linear transconductance-like property of a photoconductive switch in accordance with one or more embodiments of the present technology.

FIG. 4 is an example plot illustrating linear transconductance-like property of a photoconductive switch in accordance with one or more embodiments of the present technology. Wide-bandgap photoconductive switches capable of operating in the linear mode are also referred to as Optical Transconductance Varistors (OTVs). An OTV is device made of wide bandgap materials and controlled by light. Power can flow through the bulk of the device, enabling higher voltage breakdown and faster response time. Relying on specially doped, semi-insulating silicon carbide, the OTV's conductivity is linearly proportional to incident light intensity. The OTV switch material is bulk grown, single crystal, uniformly doped material. Optical control of the OTV excites carriers in the entire bulk of the material simultaneously so that turn on is at the speed of carrier transition from the mid-bandgap to the conduction state in less than a nanosecond. Turn off time is a function of recombination effects and occurs on the order of a ns. The OTV has been demonstrated to block>20 kV, have rise and fall transition time<10 ns dependent on the light source and driver, has multi-kA pulsed capability and an on-state resistance $R_{on}$ that is smaller or about 1 ohm, and a forward power gain>20 dB. The OTV is also capable of controlling current bi-directionally with one device, radiation hardened and electromagnetic interference (EMI) hardened. Linear mode operation results in a lifetime of >$10^7$ cycles compared to dozens of cycles in photonic switches operated in modes resulting in current filamentation. When designed for convective cooling, the OTV provides significant size reduction for low duty cycle switching. Details regarding the OTV are further described in U.S. Pat. No. 11,366,401 and U.S. Pub. No. 2022/0045232 A1, the contents of which are incorporated by reference in its entirety.

Figure 5:
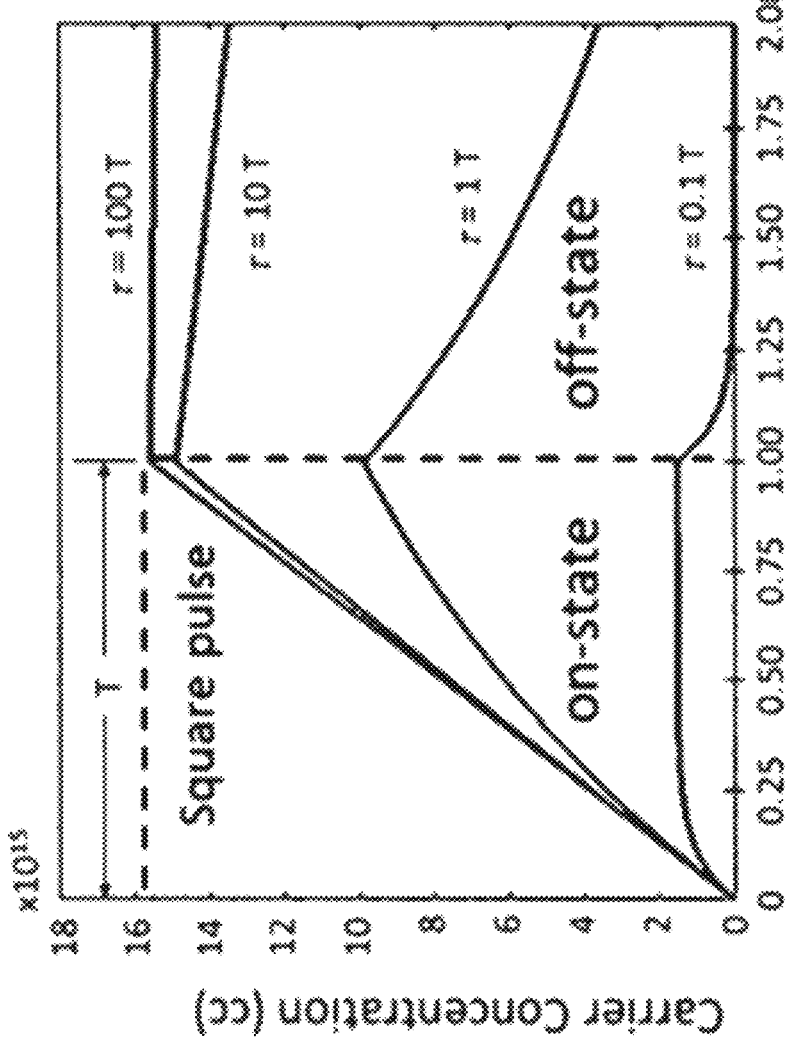
FIG. 5 illustrates an example of the photonic control response achieved by one or more embodiments of the present technology.

FIG. 5 illustrates an example of the photonic control response achieved by one or more embodiments of the present technology. As shown in FIG. 5, an input square pulse of duration T is used to optically excite the carriers from the valance band or deep levels within the bandgap. Once excited, the carriers decay according to Shockley-Read-Hall (SRH) with a recombination time, τ (see Eq. (2)). For a rectangular or square laser pulse and a short recombination time, the carrier concentration is low, but the fidelity is high. Conversely, for a long recombination time, the carrier concentration is high and the fidelity is low. Therefore, the design and optimization of the photoconductive component can be determined based on the balance between the optical power and pulse fidelity.

Figure 6:
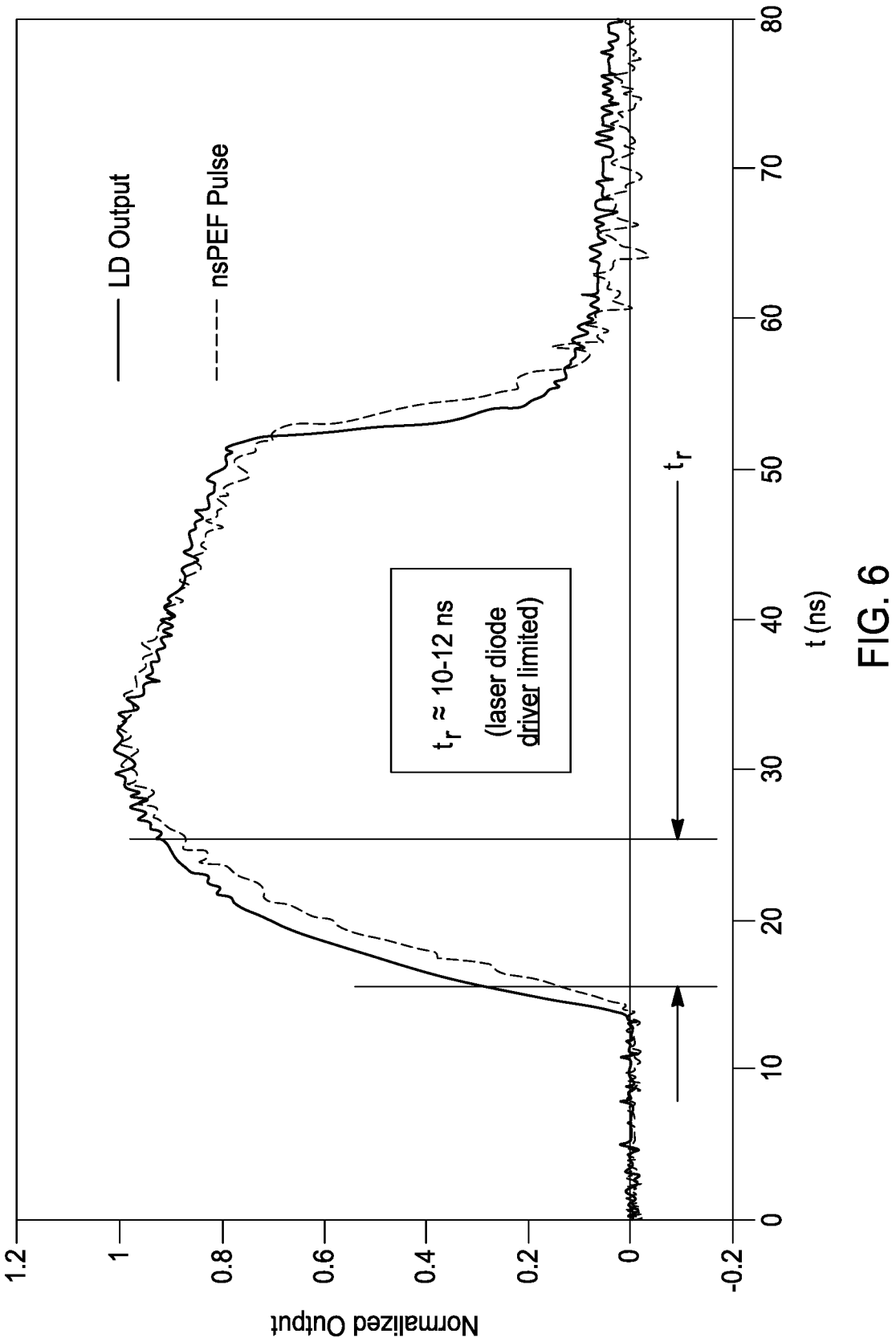
FIG. 6 illustrates an example of output pulse demonstrating the risetime of a photoconductive component in accordance with one or more embodiments of the present technology.

As discussed above, when the recombination time is small as compared to the characteristic time of the highest frequency components of the electrical signal controlling the light source, the risetime of the photoconductive component is limited by the characteristic time of highest frequency components (e.g., the laser diode). FIG. 6 illustrates that, given carrier excitation of less than 70 femtoseconds, the

Figure 7:
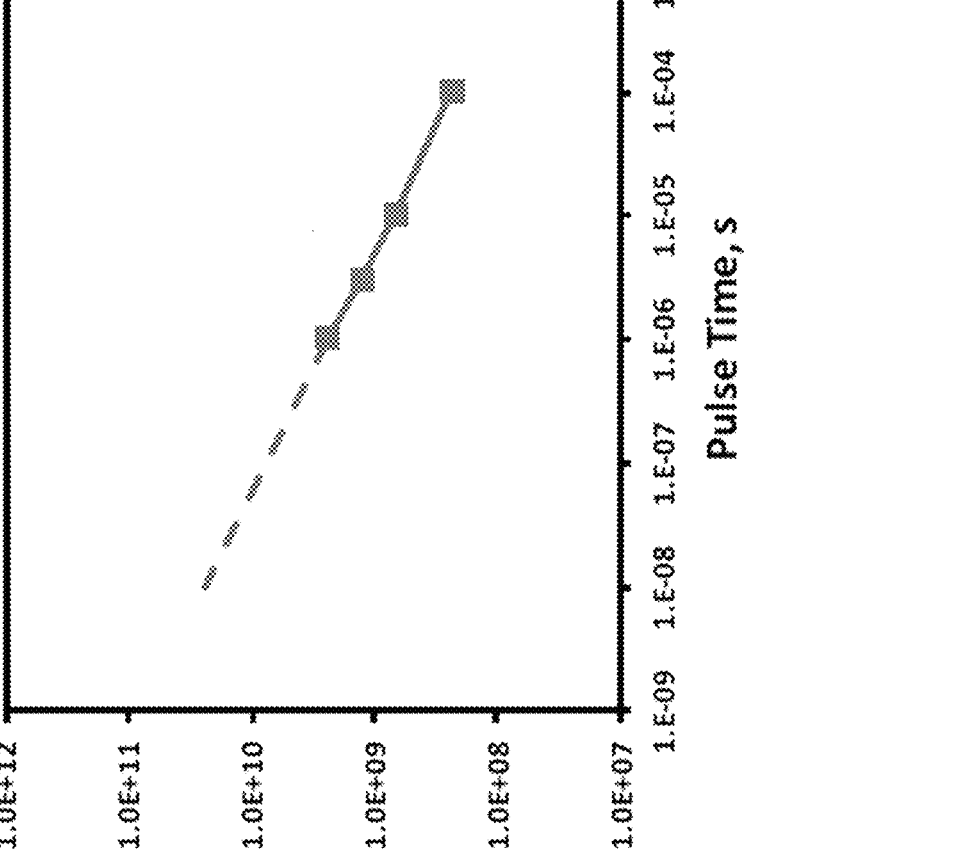
FIG. 7 illustrates an example plot developed to show different lengths of pulse time and the corresponding power density that can be used as a guideline for determining pulse time and peak current in accordance with one or more embodiments of the present technology.

6 risetime $t_r$ can be less than 20 ns (e.g., around 10-12 ns, limited by the laser diode driver). The intrinsic risetime $$t_{sw} \sim [t_{total}^2 - t_{LD}^2]^{1/2}$$

can in fact be as low as around 0.5 ns. The peak current that the photoconductive component can handle can be determined by Joule heating. FIG. 7 illustrates an example plot developed to show different lengths of pulse time and the corresponding power density, which can be used as a guideline for determining pulse time and peak current in accordance with one or more embodiments of the present technology. In some implementations, a pulse time of between $10^{-8}$ to $10^{-4}$ second (e.g., 25 μs) for the laser pulse can achieve reliable operation at around 10 kA/cm² or higher.

Figure 8:
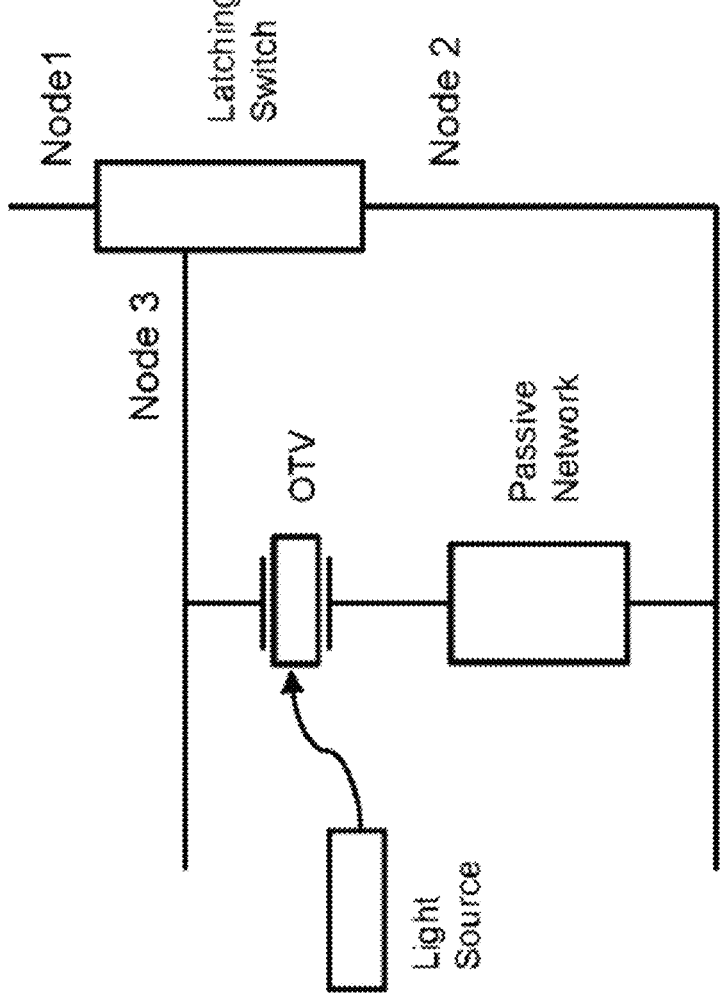
FIG. 8 illustrates an example system for fast extinguishing of conduction in accordance with one or more embodiments of the present technology.

Combined with passive networks, the OTV can quickly switch to provide a counter-pulse or a short into latching switch to extinguish conduction. FIG. 8 illustrates an example system for fast extinguishing of conduction in accordance with one or more embodiments of the present technology. The OTV can quickly switch the passive network to node 3 to provide the counter-pulse or short to extinguish conduction in the latching switch. In some embodiments, the passive network includes a combination of resistors, capacitors and/or inductors. In some embodiments, the passive network can be implemented using the stray inductance, capacitance, or resistance elements within the circuit loop. In some embodiments, the passive network allows a short between nodes 2 and 3.

Figure 9:
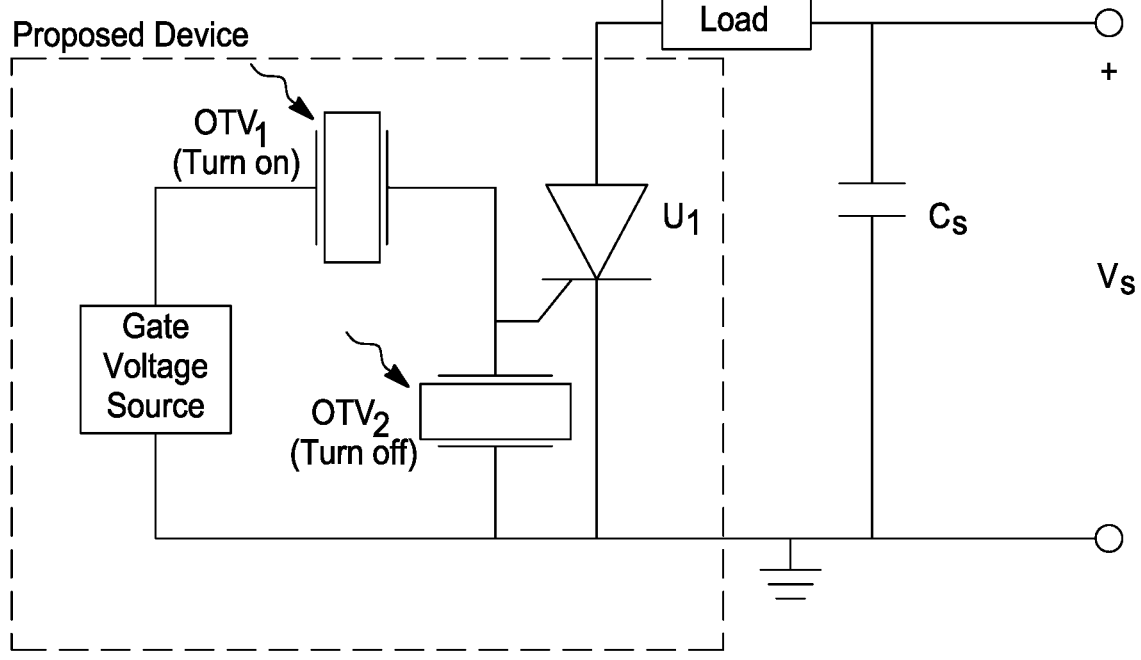
FIG. 9 illustrates an example configuration of combining OTVs with a thyristor in accordance with one or more embodiments of the present technology.

In some embodiments, the fast, high voltage, high current switching capability of the OTV can be combined with the low on resistance of a thyristor to produce a power electronic device with 4 kV holdoff, >10 A continuous conduction, 100 A/ns and 250 V/ns slew rates. FIG. 9 illustrates an example configuration of combining OTVs with a thyristor in accordance with one or more embodiments of the present technology. In this example, a thyristor serves as the main non-mechanical power switching component of the proposed device. One OTV (OTV₁) is used to switch a source such as a capacitor bank into the thyristor U1's gate to initiate over-current turn on in a number of ns. The thyristor U1 continues to conduct after OTV₁ is turned off. To turn the thyristor off, a second OTV (OTV₂) is connected to the gate of the thyristor and may have a series configuration with a passive network (e.g., gate voltage source) like FIG. 1A that is connected to the cathode of the thyristor. The OTV₂ is used to shunt the current across the thyristor U1 gate. Alternatively, OTV₂ can be placed across the anode and cathode of U1 to provide a current zero to turn the device off. OTV₁ can easily deliver the high voltage slew rate, e.g., 1 kV/ns pulse, required to trigger the thyristor U1 and can source and sink large amounts of current without affecting its switching speed. Optical control of the OTVs isolates control signals from the switched high voltage, eliminating issues caused by high di/dt induced EMI.

It is noted that overcurrent pulsing of thyristors to attain sub-nanosecond switching is utilized, in accordance with the exemplary embodiments disclosed herein, to triggering the device into continuous conduction with a controlled turn off. The disclosed techniques, for the first time, demonstrate nanosecond over-current triggering of a thyristor with controlled gate turn-off. The device combining the high voltage blocking and current carrying capabilities of a semiconductor thyristor with the switching speed of the OTV can achieve and exceed the objectives of blocking 3300 V and conducting 10 A continuously. The faster turn on and turn off times reduce transition losses and allow switching at >100 KHz.

Using the disclosed techniques, electric modules can be implemented to replace insulated-gate bipolar transistor (IGBT) modules and MOSFETs in grid equipment. For example, the disclosed techniques can be implemented in components such as renewable energy inverters, grid tied energy storage inverters, and AC-DC and DC-DC converters. With greater power handling capability in a single device, it reduces the number of devices required and increases reliability. Faster switching reduces transition losses and improves overall efficiency. By providing a high-power module with reduced switching losses, more efficient power conversion at lower initial cost is possible.

Figure 10:
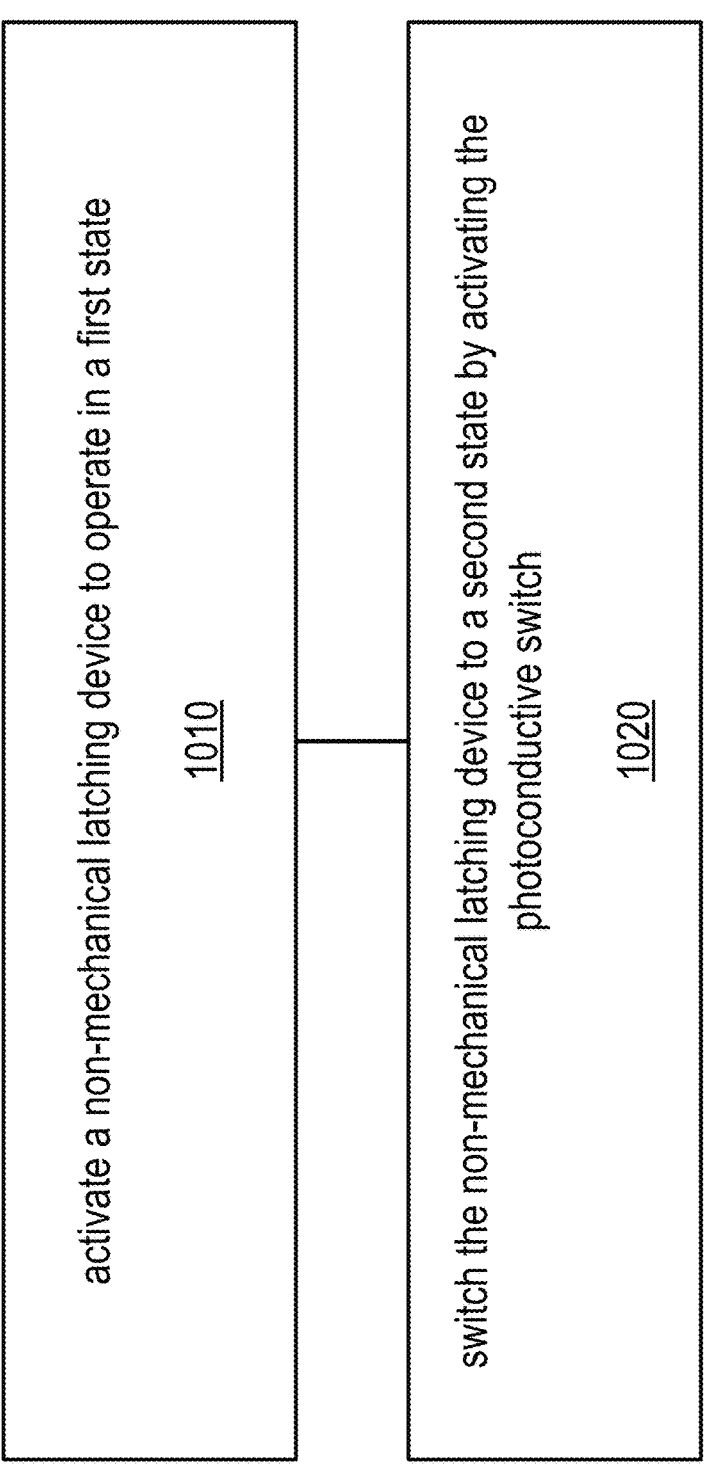
FIG. 10 is a flowchart representation of a method for fast switching a latching device in accordance with one or more embodiments of the present technology.

FIG. 10 is a flowchart representation of a method for switching a non-mechanical latching device in accordance with one or more embodiments of the present technology. The method 1000 includes, at operation 1010, activating the non-mechanical latching device to operate in a first state. The latching device is configured to maintain the first state after the first state is activated. For example, as shown in FIG. 1A and FIG. 1B. the non-mechanical latching device is coupled to a photoconductive switch. The method 1000 includes, at operation 1020, switching the non-mechanical latching device to a second state by activating the photo-conductive switch. In some embodiments, the first node and the second node of the circuit are connected upon the non-mechanical latching device switching to the second state. In some embodiments, the first node and the second node of the circuit are disconnected upon the non-mechanical latching device switching to the second state.

In some embodiments, the photoconductive switch comprises a wide bandgap material positioned to receive a pulsed signal from a light source. The wide bandgap material is doped with a dopant that forms a mid-gap state within a bandgap of the wide bandgap material to achieve a rise time that is less than 20 ns upon excitation of the wide bandgap material by the pulsed signal.

In some embodiments, the method includes supplying, by a passive network that is coupled to the photoconductive switch and the non-mechanical latching device, a counter-pulse or a short to the latching device upon activating of the photoconductive switch. In some embodiments, the passive network comprises a voltage source. In some embodiments, the passive network comprises a combination of resistors, capacitors, and/or inductors.

In some embodiments, the non-mechanical latching device comprises at least one of: a junction or bulk conduction device, a silicon-controlled rectifier, or an avalanche photoconductive semiconductor switch. In some embodiments, the non-mechanical latching device comprises a thyristor. In some embodiments, the thyristor comprises a gate, and a second photoconductive switch is coupled to the gate of the thyristor configured to activate the thyristor. A first node of the photoconductive switch is coupled to the gate of the thyristor, a second node of the photoconductive switch is coupled to a first node of the passive network, and a second node of the passive network is coupled to a cathode of the thyristor.

In some embodiments, switching of the latching device between the first state and the second state is completed within 10 ns.

Table 1 shows comparison results between an example embodiment implemented using the disclosed techniques and conventional devices. This embodiment uses the high-speed capability of an example OTA. As shown in Table 1, the example embodiment can achieve much higher switching frequency (e.g., around or above 100 kHz) and voltage/current slew rates that are not achievable by the conventional technology. For example, the example slew rates shown in the table can be achieved by driving the gates on high-speed OTV devices at three times the normal gate current, but for shorter equivalent time to prevent damage. The OTV also has a very high resistance when off and can be turned on and off rapidly at rates exceeding 1 MHz. By using the OTV to shunt current away from the gate to cathode or anode to cathode, the thyristors or IGBT can turn off to enable the 100 kHz and faster switching frequency.

| Parameter | IGBT | MOSFET | Thyristor | Example Embodiment |
|---|---|---|---|---|
| Voltage Rating (kV) | 6.5 | 10 | 7.5 | 6 |
| Current Rating (A) | 4000 | 40 | 2300 | 10 |
| Switching Frequency (kHz) | N/A | N/A | N/A | 100 |
| Voltage Slew Rate (V/ns) | 32.5 | 78 (rise) 111 (fall) | 2 | 250 |
| Current Slew Rate (A/ns) | 2 | <1 | 5 | 100 |

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A device, comprising:
a photoconductive switch including a wide bandgap material positioned to receive an optical signal, the wide bandgap material doped with a dopant to form a mid-gap state within a bandgap of the wide bandgap material to achieve an enhanced rise time when excited by the optical signal; and
a non-mechanical latching switch configured to maintain a state after the state is activated, the photoconductive switch coupled to the non-mechanical latching switch, wherein the non-mechanical latching switch is configured to be triggered to switch to an opposite state upon an activation of the photoconductive switch.

2. The device of claim 1, wherein, upon the activation of the photoconductive switch, the non-mechanical latching switch is triggered to turn on.

3. The device of claim 1, wherein, upon the activation of the photoconductive switch, the non-mechanical latching switch is triggered to turn off.

4. The device of claim 1, wherein the mid-gap state within the bandgap of the wide bandgap material enables a rise time of less than 10 ns upon excitation of the wide bandgap material by the pulsed signal.

5. The device of claim 1, comprising:
a passive network coupled to the photoconductive switch and to the non-mechanical latching switch,
wherein the passive network and the photoconductive switch are positioned in a series configuration with respect to each other, and
wherein the passive network is operable, upon the activation of the photoconductive switch, to provide a counter-pulse or a short to the non-mechanical latching switch to produce a zero current condition.

6. The device of claim 5, wherein:
a first node of the photoconductive switch is coupled to a third node of the non-mechanical latching switch,
a second node of the photoconductive switch is coupled to a first node of the passive network,
a second node of the passive network is coupled to a second node of the non-mechanical latching switch, and
a current flow through the non-mechanical latching switch is conducted between a first node and the second node of the non-mechanical latching switch.

7. The device of claim 5, wherein:
a first node of the photoconductive switch is coupled to a first node of the non-mechanical latching switch,
a second node of the photoconductive switch is coupled to a first node of the passive network,
a second node of the passive network is coupled to a second node of the non-mechanical latching switch, and
a current flow through the non-mechanical latching switch is conducted between the first node and the second node of the non-mechanical latching switch.

8. The device of claim 5, wherein the passive network comprises a voltage source.

9. The device of claim 5, wherein the passive network comprises a combination of resistors, capacitors, and/or inductors.

10. The device of claim 1, wherein the non-mechanical latching switch comprises a thyristor.

11. The device of claim 10, wherein the thyristor comprises a gate, and wherein:
a second photoconductive switch is coupled to the gate of the thyristor configured to activate the thyristor,
a first node of the photoconductive switch is coupled to the gate of the thyristor,
a second node of the photoconductive switch is coupled to a first node of a passive network,
a second node of the passive network is coupled to a cathode of the thyristor.

12. The device of claim 11, wherein the device is configured to operation at a switching frequency around 100,000 KHz.

13. The device of claim 1, wherein the non-mechanical latching switch comprises at least one of: a junction or bulk conduction device, a silicon-controlled rectifier, or an avalanche photoconductive semiconductor switch.

14. A method for switching a non-mechanical latching device, comprising:
activating the non-mechanical latching device to operate in a first state, wherein the non-mechanical latching device is configured to maintain the first state after the first state is activated, wherein the non-mechanical latching device is coupled to a photoconductive switch in a circuit; and
switching the non-mechanical latching device to a second state by providing an optical signal to the photoconductive switch to activate the photoconductive switch, wherein the photoconductive switch has a wide bandgap material, the wide bandgap material being doped with a dopant to create a mid-gap state within a bandgap of the wide bandgap material to achieve an enhanced rise time when the photoconductive switch is excited by the optical signal.

15. The method of claim 14, wherein the optical signal comprises a pulsed optical signal, and wherein the wide bandgap material is positioned to receive the pulsed signal from the light source, and the wide bandgap material achieves a rise time that is less than 20 ns upon excitation of the wide bandgap material by the pulsed optical signal.

16. The method of claim 14, further comprising:
supplying, by a passive network that is coupled to the photoconductive switch and the non-mechanical latching device, a counter-pulse or a short to the non-mechanical latching device upon activating of the photoconductive switch.

17. The method of claim 16, wherein the passive network comprises a voltage source or a combination of resistors, capacitors, and/or inductors.

18. The method of claim 14, wherein the non-mechanical latching device comprises at least one of: a junction or bulk conduction device, a silicon-controlled rectifier, or an avalanche photoconductive semiconductor switch.

19. The method of claim 14, wherein the non-mechanical latching device comprises a thyristor that comprises a gate, and wherein:
a second photoconductive switch is coupled to the gate of the thyristor configured to activate the thyristor,
a first node of the photoconductive switch is coupled to the gate of the thyristor,
a second node of the photoconductive switch is coupled to a first node of a passive network, and
a second node of the passive network is coupled to a cathode of the thyristor.

20. The method of claim 14, wherein switching of the latching device between the first state and the second state is completed within 10 ns.

\* \* \* \* \*